(12) United States Patent
Hsieh et al.

(10) Patent No.: US 9,553,243 B2
(45) Date of Patent: Jan. 24, 2017

(54) LIGHT EMITTING DEVICE

(71) Applicant: Epistar Corporation, Hsinchu (TW)

(72) Inventors: Min-Hsun Hsieh, Hsinchu (TW);
Ta-Cheng Hsu, Hsinchu (TW);
Meng-Lun Tsai, Hsinchu (TW);
Chih-Chiang Lu, Hsinchu (TW);
Chien-Yuan Wang, Hsinchu (TW);
Yen-Wen Chen, Hsinchu (TW); Ya-Ju Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 8 days.

(21) Appl. No.: 14/246,319

(22) Filed: Apr. 7, 2014

(65) Prior Publication Data

US 2014/0306253 A1    Oct. 16, 2014

Related U.S. Application Data

(63) Continuation of application No. 11/878,193, filed on Jul. 23, 2007, now Pat. No. 8,692,270.

(30) Foreign Application Priority Data

Jul. 21, 2006 (TW) ................. 95126899 A

(51) Int. Cl.
*H01L 33/50* (2010.01)
*H01L 33/64* (2010.01)
*H01L 33/60* (2010.01)
*H01L 33/48* (2010.01)
*H01L 33/54* (2010.01)
*H01L 33/62* (2010.01)

(52) U.S. Cl.
CPC ............ *H01L 33/50* (2013.01); *H01L 33/486* (2013.01); *H01L 33/54* (2013.01); *H01L 33/60* (2013.01); *H01L 33/64* (2013.01); *H01L 33/507* (2013.01); *H01L 33/62* (2013.01); *H01L 33/641* (2013.01); *H01L 2224/48091* (2013.01); *H01L 2224/49107* (2013.01); *H01L 2924/01322* (2013.01)

(58) Field of Classification Search
CPC ........ H01L 33/64; H01L 33/60; H01L 33/486; H01L 33/50; H01L 33/54; H01L 33/507; H01L 33/62; H01L 33/641
USPC ............ 257/98, E33.057, E33.061, E33.062, 257/E33.06
See application file for complete search history.

(56) References Cited

U.S. PATENT DOCUMENTS

| | | | |
|---|---|---|---|
| 6,414,339 B1 * | 7/2002 | Tsutsui | 257/99 |
| 7,138,660 B2 * | 11/2006 | Ota et al. | 257/79 |
| 7,384,153 B2 * | 6/2008 | Nakamura | H04N 9/3144 348/750 |
| 7,560,741 B2 * | 7/2009 | Harle et al. | 257/98 |
| 7,824,937 B2 * | 11/2010 | Suehiro | H01L 33/56 257/E21.504 |

(Continued)

FOREIGN PATENT DOCUMENTS

| | | | | |
|---|---|---|---|---|
| WO | WO 2004077578 A2 * | 9/2004 | ............ | H01L 33/00 |
| WO | WO 2004082036 A1 * | 9/2004 | ............ | H01L 33/00 |

*Primary Examiner* — Latanya N Crawford
(74) *Attorney, Agent, or Firm* — Ditthavong & Steiner, P.C.

(57) ABSTRACT

This disclosure relates to a light-emitting apparatus comprising a submount, a chip carrier formed on the submount, a light-emitting chip formed on the chip carrier, a reflecting cup formed on the submount and enclosing the light-emitting chip and the chip carrier, and a transparent encapsulating material for encapsulating the light-emitting chip.

17 Claims, 9 Drawing Sheets

(56) References Cited

U.S. PATENT DOCUMENTS

| | | | |
|---|---|---|---|
| 8,124,998 B2* | 2/2012 | Kim | 257/99 |
| 8,164,825 B2* | 4/2012 | Narendran | H01L 33/507 |
| | | | 359/326 |
| 8,735,920 B2* | 5/2014 | Ibbetson et al. | 257/98 |
| 2005/0156187 A1* | 7/2005 | Isokawa et al. | 257/100 |
| 2005/0162069 A1* | 7/2005 | Ota et al. | 313/501 |
| 2005/0270493 A1* | 12/2005 | Nakamura | H04N 9/3144 |
| | | | 353/31 |
| 2006/0118800 A1* | 6/2006 | Kim | 257/98 |
| 2006/0171152 A1* | 8/2006 | Suehiro et al. | 362/363 |
| 2006/0261364 A1* | 11/2006 | Suehiro et al. | 257/100 |
| 2006/0270078 A1* | 11/2006 | Kim et al. | 438/26 |
| 2007/0012940 A1* | 1/2007 | Suh et al. | 257/99 |
| 2007/0064131 A1* | 3/2007 | Sawanobori et al. | 348/294 |
| 2007/0221938 A1* | 9/2007 | Radkov | C09K 11/7734 |
| | | | 257/98 |
| 2008/0023711 A1* | 1/2008 | Tarsa et al. | 257/98 |
| 2008/0026498 A1* | 1/2008 | Tarsa et al. | 438/26 |
| 2008/0099770 A1* | 5/2008 | Mendendorp | H01L 33/64 |
| | | | 257/79 |
| 2011/0102884 A1* | 5/2011 | Narendran et al. | 359/326 |

* cited by examiner

US 9,553,243 B2

LIGHT EMITTING DEVICE

REFERENCE TO RELATED APPLICATION

The present application claims the right of priority based on Taiwan Application Serial Number 095126899, filed Jul. 21, 2006, the disclosure of which is incorporated herein by reference in its entirety.

TECHNICAL FIELD

This invention relates to a light-emitting chip, and a light-emitting apparatus comprising the light-emitting chip.

BACKGROUND OF THE DISCLOSURE

Light extraction efficiency of light-emitting diodes (LEDs) has become an important topic in improving brightness. A variety of conventional skills has been focused on the research of the surface roughening of LED chips for increasing the light extraction efficiency of LED chips. For example, texturing the top or bottom surface of the substrate by wet etching or dry etching for improving the scattering effect of the substrate, or roughening the top surface of the epitaxial structure by etching or growth method such that more light can be extracted from the top side of the LED chip have been tried to improve the light extraction efficiency of LED chips themselves. In addition, an adapted package form also plays a role in helping LED chips to achieve excellent light extraction efficiency.

FIG. 1 shows an conventional SMD (Surface Mount Device) type LED apparatus 10 comprising a submount 11 having a first conductive line 111 and a second conductive line 112, an LED chip 13 formed on the central portion of the submount 11, a reflecting cup 12 formed on the submount 11 and enclosing the LED chip 13, and a transparent encapsulating material 14 filled in the cavity formed by the reflecting cup 12 for encapsulating the LED chip 13. The light-emitting chip 13 comprises a first electrode (not shown) and a second electrode (not shown) electrically connected to the first conductive line 111 and the second conductive line 112 correspondingly by separate wires 19. The first conductive line 111 and the second conductive line 112 are extended from the top surface to the bottom surface of the submount 11 for mounting on a printed circuit board (PCB). The reflecting cup 12 redirects the light emitted from the LED chip 13 upwardly to form a directional light beam. Having the whole cavity filled with the transparent encapsulating material 14, part of the light is not able to transmit through the transparent encapsulating material 14 due to the total reflection at the interface between the transparent encapsulating material 14 and the ambient surroundings. Besides, it is difficult to dissipate the heat generated from the LED chip 13 through the reflecting cup 12.

U.S. Patent Publication No. US2005/0067628 proposes a way to overcome the abovementioned problems. As shown in FIG. 2, a transparent encapsulating material 24 encapsulates only an LED chip 23 such that the majority of light is able to pass through the transparent encapsulating material 24, and the probability of total reflection is significantly lowered. However, part of light is still confined within the reflecting cup. Moreover, spaces are formed between the reflecting cup 22 and a cup supporter 221 for disposing some peripheral electronic elements and it is difficult to dissipate the heat generated from the LED chip 23 through the reflecting cup 22.

In view of the above, the invention proposes a light-emitting apparatus for improving the light extraction efficiency and the heat dissipation.

SUMMARY OF THE DISCLOSURE

One aspect of the invention proposes a light-emitting apparatus having a chip carrier formed between an LED chip and a submount. The light-emitting apparatus comprises a submount having a first conductive line and a second conductive line, a chip carrier formed on the submount, an LED chip formed on the chip carrier, a reflecting cup formed on the submount and enclosing the LED chip and the chip carrier, and a transparent encapsulating material encapsulating the LED chip. The LED chip comprises a first electrode and a second electrode electrically connected to the first conductive line and the second conductive line by separate wires.

In one embodiment, the ratio of the height of the chip carrier to the height of the reflecting cup is within a predetermined range.

In another embodiment, the chip carrier is integrally formed as a part of the LED chip or the submount.

Another aspect of this invention proposes a chip unit having a chip carrier. The chip unit further comprises a growth substrate formed on the chip carrier, a light-emitting stack formed on the growth substrate, a first electrode and a second electrode electrically connected to the light-emitting stack.

DETAILED DESCRIPTION OF THE PREFERRED EMBODIMENTS

Figure 1:
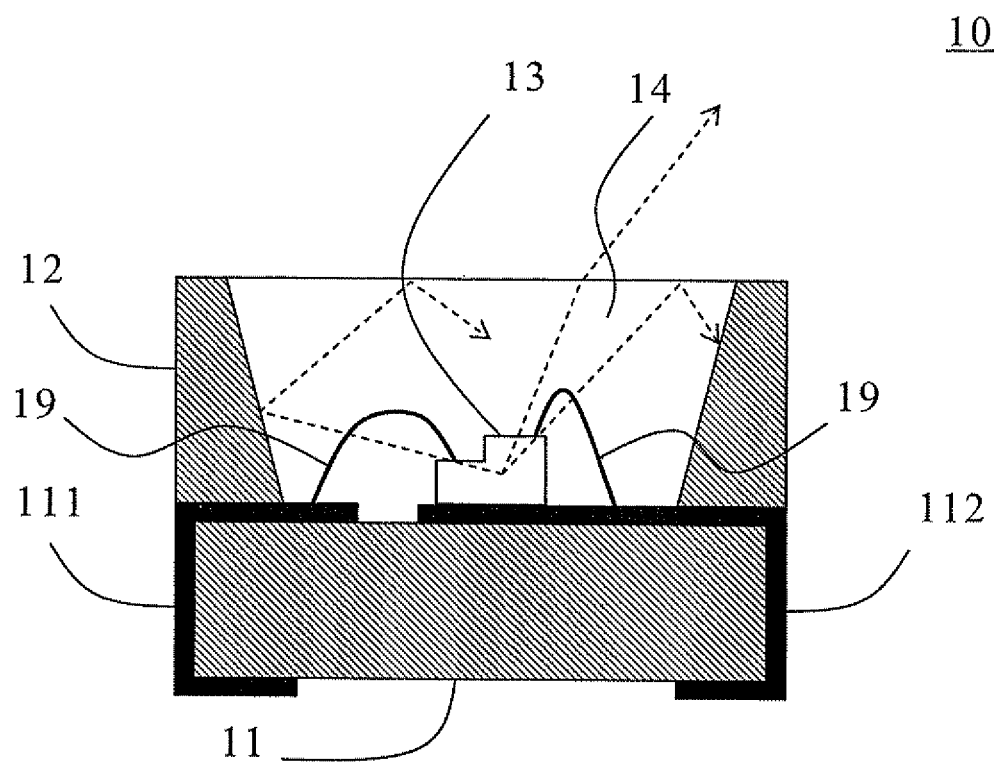
FIG. 1 shows a light-emitting apparatus according to one prior art.
Figure 2:
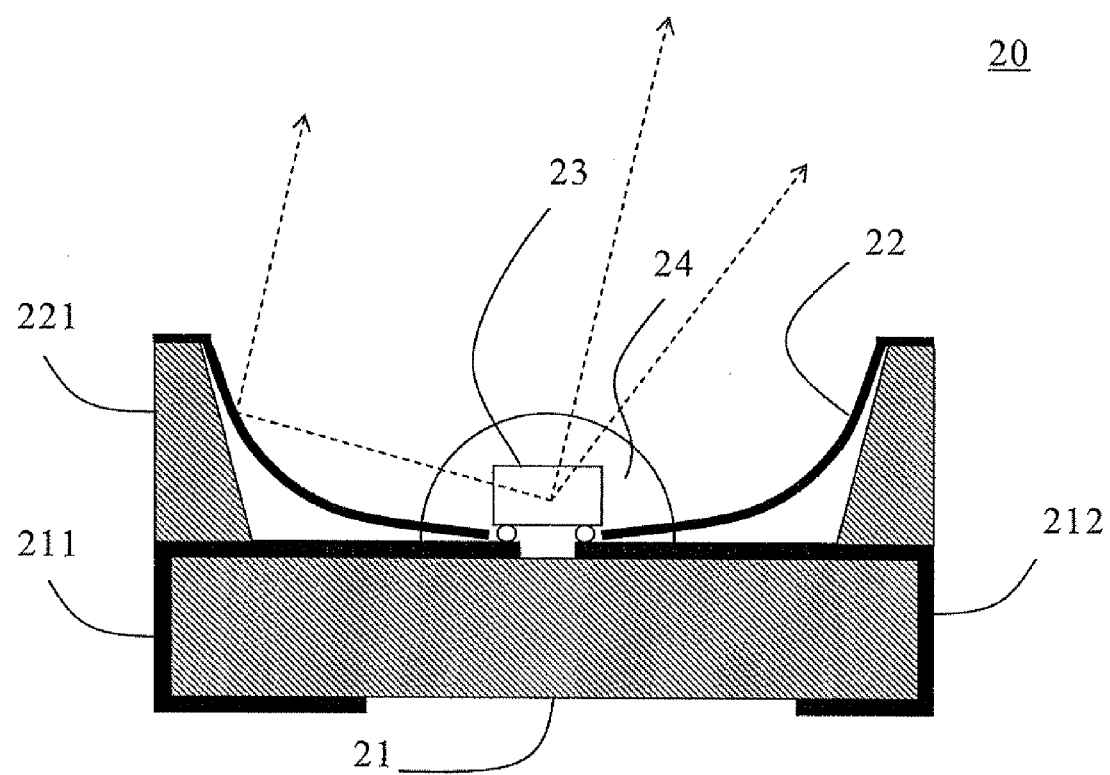
FIG. 2 shows a light-emitting apparatus according to another prior art.
Figure 3:
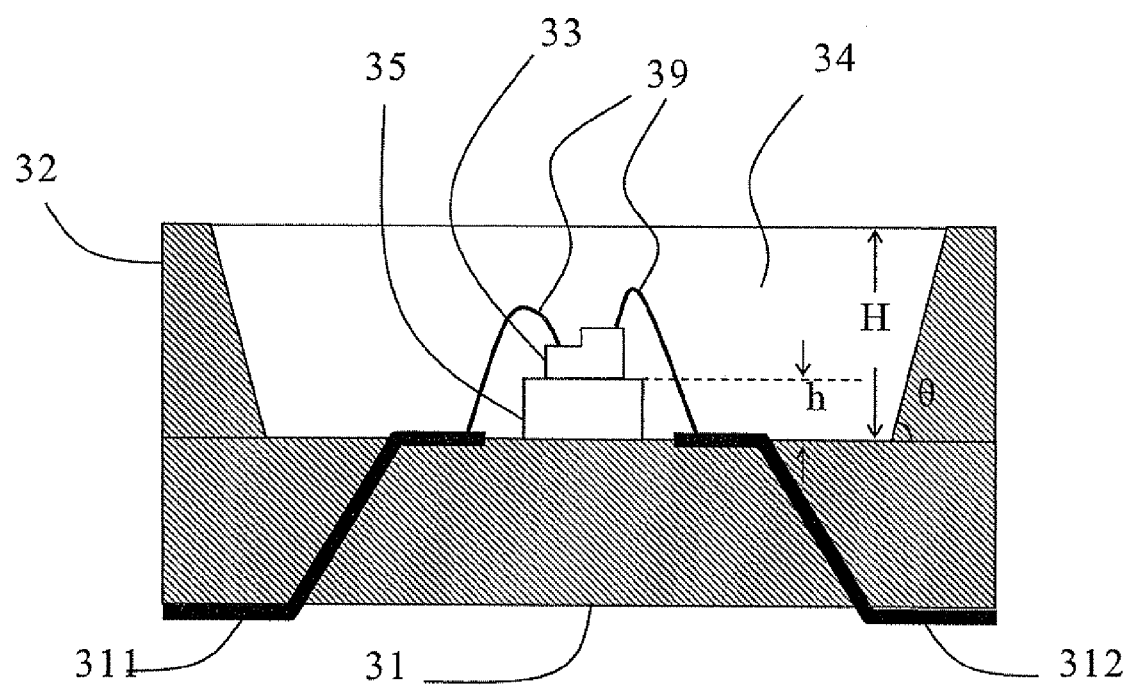
FIG. 3 shows a light-emitting apparatus according to the first embodiment of the present invention.

FIG. 3 shows one embodiment according to the present disclosure. A light-emitting apparatus 30 comprises a submount 31 having a first conductive line 311 and a second conductive line 312, a chip carrier 35 formed on the submount 31, an LED chip 33 formed on the chip carrier 35, a reflecting cup 32 formed on the submount 31 and enclosing the LED chip 33, and a transparent encapsulating material 34 filled in the cavity formed by the reflecting cup 32. The LED chip 33 comprises a first electrode (not shown) and a second electrode (not shown) electrically connected to the first conductive line 311 and the second conductive line 312 by separate wires 39. The first conductive line 311 and the second conductive line 312 are extended from the top surface to the bottom surface of the submount 31 for mounting on a printed circuit board (PCB). The reflecting cup 32, the submount 31, and/or the chip carrier 35 comprise a reflecting surface or a reflecting layer (not shown) formed thereon for redirecting the light emitted from the LED chip 33 upwardly to form a directional light beam. The reflecting layer comprises at least one material selected from the group consisting of silver, aluminum, silicon oxide, and aluminum oxide. The chip carrier 35, the submount 31, and the reflecting cup 32 can be formed integrally or separately. It is preferred that the chip carrier 35 can be bonded to the submount 31 by an adhesive layer. The adhesive layer comprises at least one material selected from the group consisting of metal, metal alloy, eutectic metal alloy, silver paste, polyimide, benzocyclobutene (BCB), perfluorocyclobutane (PFCB), epoxy resin, and silicone. The bonded structure is advantageous for dimension tuning. Moreover, it enhances the light extraction efficiency by matching the LED chip and the reflecting cup to a chip carrier with an appropriate height.

Figure 4:
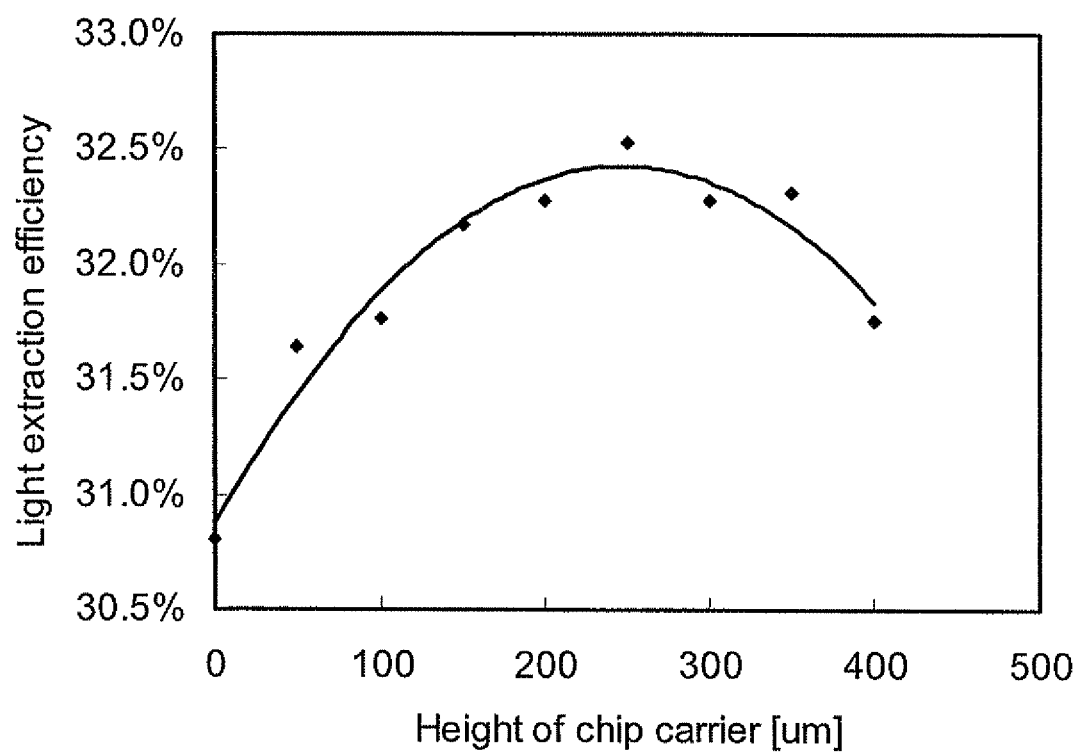
FIG. 4 demonstrates the simulation result of the correlation curve of the height of the chip carrier versus the light extraction efficiency.

FIG. 4 shows the effect of the height of the chip carrier to the light extraction efficiency according to the present disclosure. Please also refer to FIG. 3, the exemplified dimensions of the light-emitting apparatus 30 are measured and described subsequently. The height of the reflecting cup 32 is 1 mm, the height of the LED chip 33 is 95 um, the dimension of the LED chip 33 is 380 um by 380 um, the forming angle θ between the reflecting cup 32 and the submount 31 is about 80 degree, and the top area of the height of the chip carrier 35 is about 500 um by 500 um. The light extraction efficiency can be enhanced by controlling the carrier height from 50 um to 400 um, i.e. the ratio of height of the chip carrier h to the height of the reflecting cup H is about 0.1 to 0.4. To further improve the light extraction efficiency, it is achievable to fine tune those dimensions, such as the forming angle θ, the ratio of the width of the LED chip and that of the reflecting cup (or the width of the submount) for better performance.

Figure 5:
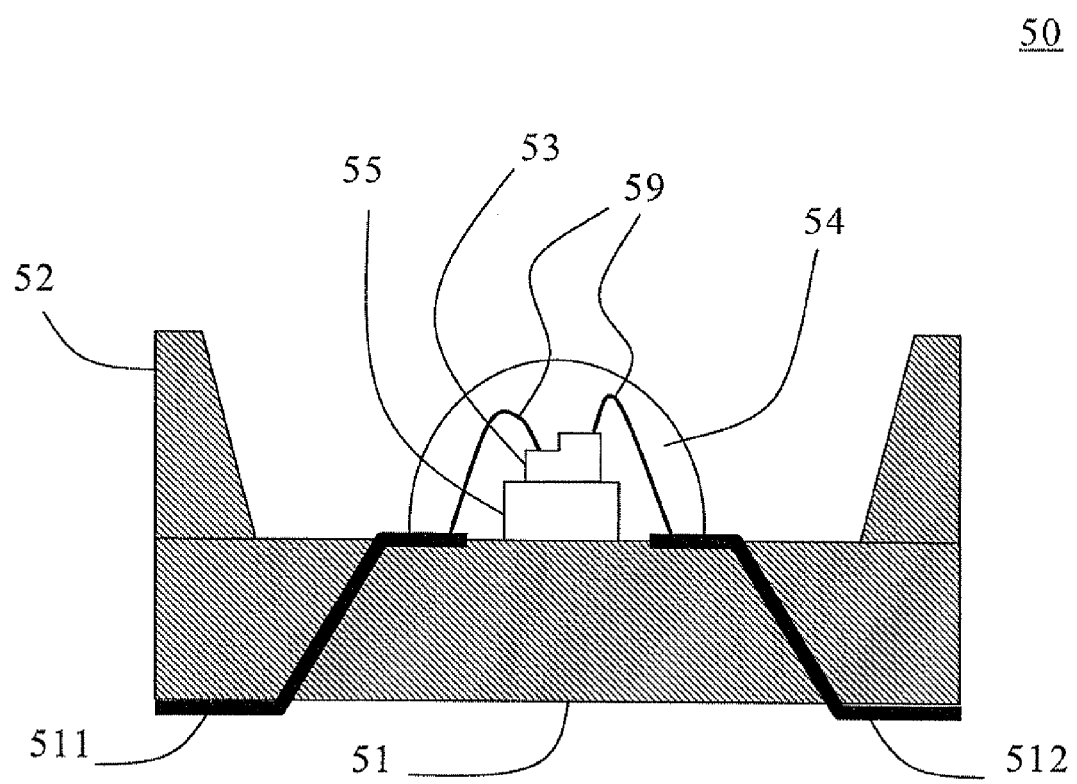
FIG. 5 shows a light-emitting apparatus according to the second embodiment of the present invention.

FIG. 5 shows another embodiment according to the present disclosure. A light-emitting apparatus 50 comprises a submount 51 having a first conductive line 511 and a second conductive line 512 extended from the top surface to the bottom surface of the submount 51, a chip carrier 55 formed on the submount 51, an LED chip 53 formed on the chip carrier 55, a reflecting cup 52 formed on the submount 51 and enclosing the LED chip 53 and the chip carrier 55, and a transparent encapsulating material 54 encapsulating only the LED chip 53 and the chip carrier 55. The LED chip 53 comprises a first electrode (not shown) and a second electrode (not shown) electrically connected to the first conductive line 511 and the second conductive line 512 by separate wires 59. The reflecting cup 52, the submount 51, and/or the chip carrier 55 comprise a reflecting surface or a reflecting layer (not shown) formed thereon. The reflecting layer comprises at least one material selected from the group consisting of silver, aluminum, silicon oxide, and aluminum oxide. The reflecting cup 52 and/or the chip carrier 55 comprise a material having a high thermal conductivity, such as silicon, aluminum, copper, or silver, for conducting the heat generated by the LED chip 53 into the atmosphere by the reflecting cup 52. The chip carrier 55, the submount 51, and the reflecting cup 52 can be formed integrally or separately. Since the transparent encapsulating material 54 encapsulates only the LED chip 53 and the chip carrier 55 instead of filling the whole cavity formed by reflecting cup 52, the light extraction efficiency can be further improved.

Figure 6:
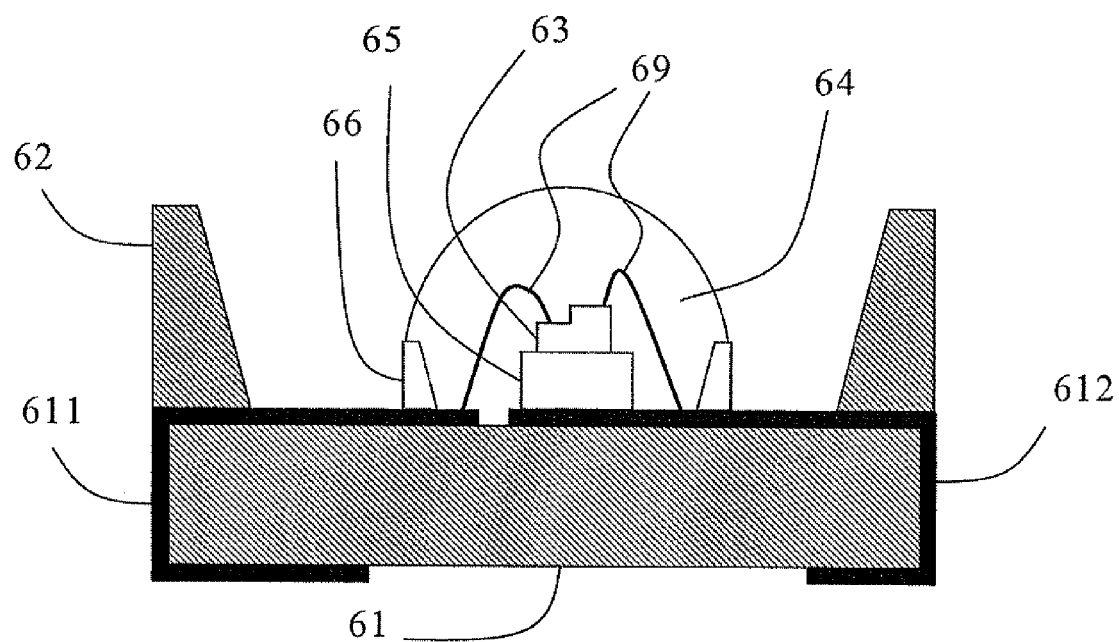
FIG. 6 shows a light-emitting apparatus according to the third embodiment of the present invention.

FIG. 6 shows another embodiment according to the present invention. A light-emitting apparatus 60 comprises a submount 61 having a top and bottom surface, a first conductive line 611 and a second conductive line 612 extended from the top surface to the bottom surface of the submount 61, a chip carrier 65 formed on the submount 61, an LED chip 63 formed on the chip carrier 65, a reflecting cup 62 formed on the submount 61 and enclosing the LED chip 63 and the chip carrier 65, and a transparent encapsulating material 64 encapsulating only the LED chip 63 and the chip carrier 65. The LED chip 63 comprises a first electrode (not shown) and a second electrode (not shown) electrically connected to the first conductive line 611 and the second conductive line 612 by separate wires 69. The reflecting cup 62, the submount 61, and/or the chip carrier 65 comprise a reflecting surface or a reflecting layer (not shown) formed thereon. The reflecting layer comprises at least one material selected from the group consisting of silver, aluminum, silicon oxide, and aluminum oxide. A transparent stand 66 is formed on the submount 61 and encloses the LED chip 63 for confining the transparent encapsulating material 64 adjacent to the LED chip 63 and preventing the transparent encapsulating material 64 from out-spreading which will adversely affects the curvature of the transparent encapsulating material 64. In a preferred embodiment, the transparent stand 66 is not higher than the chip carrier 65 in order to keep the shape of the transparent stand 66 to be substantially hemisphere. In a preferred embodiment, the chip carrier 65 can be integrally formed as a part of the submount 61.

Figure 7:
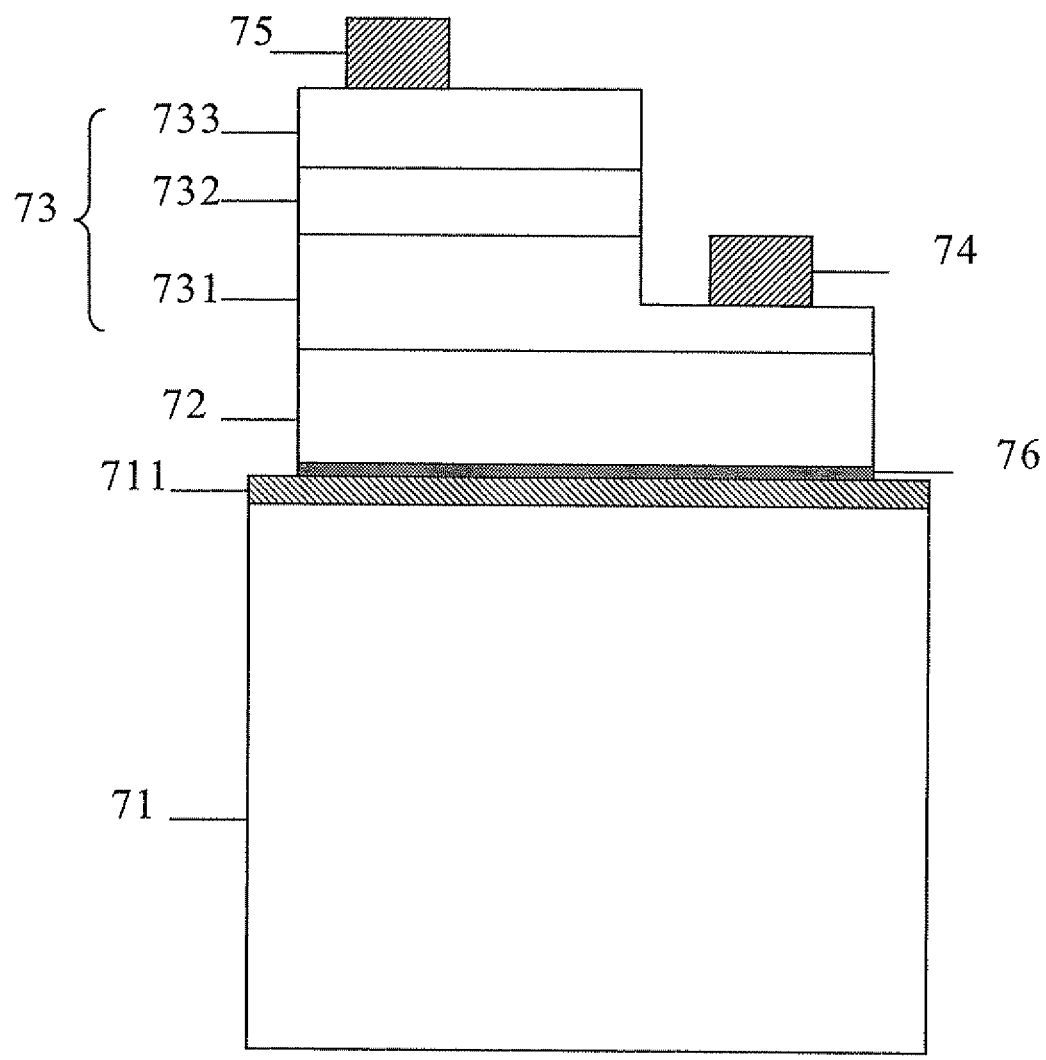
FIG. 7 shows a chip unit according to one embodiment of the present invention.

FIG. 7 shows one embodiment of a chip carrier 71 being integrally formed as a part of a chip unit 70. The chip unit 70 can be bonded to a submount. The chip unit 70 having the chip carrier 71, further comprises a growth substrate 72 bonded to the chip carrier 71 by an adhesive layer 76, a light-emitting stack 73 formed on the growth substrate 72, a first electrode, a second electrode electrically coupled to the light-emitting stack 73, and a reflective layer 711 formed between the chip carrier 71 and the light-emitting stack 73. The chip carrier 71 comprises a material having high thermal conductivity, such as silicon, aluminum, copper or silver. The adhesive layer 76 comprises at least one material selected from the group consisting of silver paste, polyimide, benzocyclobutene (BCB), perfluorocyclobutane (PFCB), epoxy resin, and silicone. The growth substrate 72 comprises at least one material selected from the group consisting of sapphire, GaN, glass, GaP, SiC, and CVD diamond. The light-emitting stack 73 emits light when driving under a voltage bias. The color of light depends on the material system of the light-emitting stack 73. For example, $(Al_pGa_{1-p})_qIn_{(1-q)}P$ series will emit reddish, yellowish, or greenish light depending on the value of p, q; whereas $Al_xIn_yGa_{(1-x-y)}N$ series will emit bluish, or violet light depending on the value of x, y. The light-emitting stack 73 comprises a first semiconductor layer 731 of first conductivity-type, a second semiconductor layer 733 of second conductivity-type opposite to the first conductivity-type, an active layer 732 interposed between the first semiconductor layer 731 and the second semiconductor layer 733. The structure of the active layer 732 can be double-heterojunction (DH) or multi-quantum well (MQW) for higher internal quantum efficiency. Although FIG. 7 depicts a lateral structure of the first electrode 74 and the second electrode 75 on the same side with respect to the growth substrate 72, it is still under the scope of the invention, for those skill in the art to modify the chip unit 70 in accordance with the present invention to be a vertical-type form.

Figure 8:
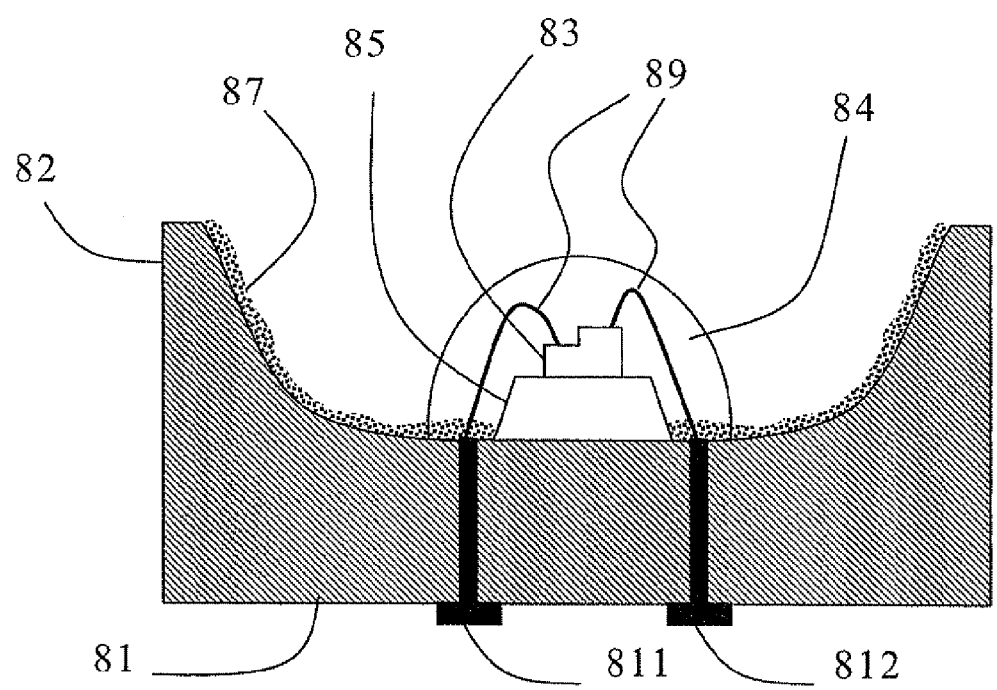
FIG. 8 shows a light-emitting apparatus comprising a light-converting layer according to one embodiment of the present invention.
Figure 9:
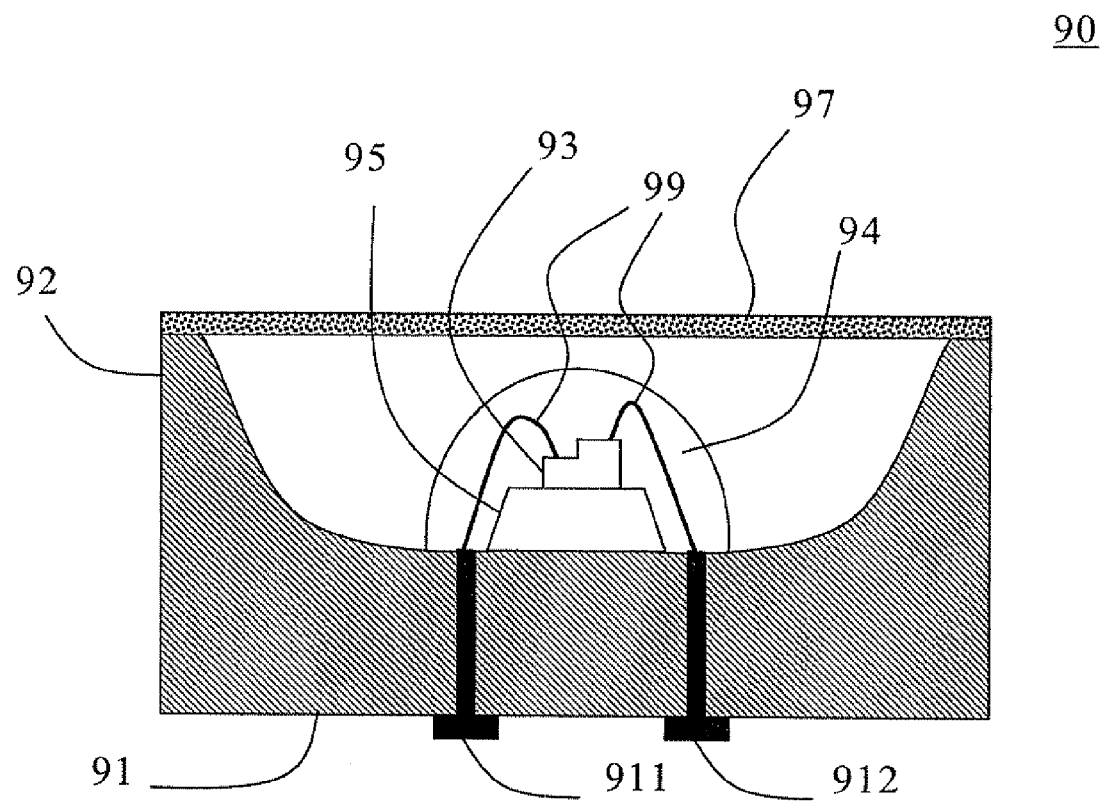
FIG. 9 shows a light-emitting apparatus comprising a light-converting layer according to another embodiment of the present invention.

FIG. 8 exemplifies one embodiment according to the present invention for converting the light emitted by an LED chip 83 into white or other visible light via a light-converting layer 87 conformably coated on the surface of a reflecting cup 82 and a submount 81. The light-converting layer 87 comprises the well-known phosphor materials, such as YAG, TAG, oxy-nitride compound, or silicate compound. The light-emitting stack of the LED chip 83 comprises GaN or AlGaInP. It is also preferred to form the light-converting layer 97 adjacent to the top region of the reflecting cup in a remote-coating fashion.

It should be noted that the proposed various embodiments are not for the purpose to limit the scope of the invention. Any possible modifications without departing from the spirit of the invention may be made and should be covered by the invention.

What is claimed is:

1. A light-emitting device, comprising:
   a submount having a upper surface, a lower surface, and an outermost lateral surface;
   an LED chip;
   a chip carrier arranged between the upper surface and the LED chip;
   a first conductive line penetrating the submount, and having a first end exposed on the upper surface and connected to the LED chip, and a second end exposed on the lower surface without touching the outermost lateral surface;
   a light converting layer covering the LED chip and the chip carrier without directly contacting the LED chip; and
   a transparent material entirely covering the chip carrier and the first end of the first conductive line that is exposed on the upper surface, covering the LED chip without directly contacting the light converting layer, and directly contacting the submount.

2. The light-emitting device of claim 1, further comprising a second conductive line electrically connected to the LED chip and penetrating the submount without covered by the LED chip or the chip carrier.

3. The light-emitting device of claim 2, wherein the chip carrier is arranged between the first conductive line and the second conductive line.

4. The light-emitting device of claim 1, further comprising a bonding layer arranged between the LED chip and the chip carrier.

5. The light-emitting device of claim 1, further comprising a reflecting layer formed on the chip carrier and being wider than the LED chip.

6. The light-emitting device of claim 1, wherein the second end is wider than first end.

7. The light-emitting device of claim 1, wherein the light converting layer is arranged in a configuration that any part of the submount is lower than the light converting layer.

8. The light-emitting device of claim 1, wherein the first end is not covered by the LED chip or the chip carrier.

9. The light-emitting device of claim 1, wherein the light converting layer is substantially connected to the outermost lateral surface.

10. The light-emitting device of claim 1, further comprising a reflecting layer formed between the chip carrier and the LED chip.

11. The light-emitting device of claim 1, wherein the LED chip comprises a bottom surface, the chip carrier comprises a top surface having a width substantially equal to that of the bottom surface.

12. The light-emitting device of claim 1, further comprising an adhesive layer formed between the submount and the chip carrier.

13. A light-emitting device, comprising:
   a submount having an outermost lateral surface and a protruding portion;
   an LED chip;
   a chip carrier arranged between the submount and the LED chip;
   a first conductive line penetrating the submount, and having a first end exposed on the upper surface and connected to the LED chip, and a second end not touching the outermost lateral surface;
   a transparent material entirely covering the chip carrier and the first end of the first conductive line that is exposed on the upper surface, and directly contacting the submount; and
   a light converting layer covering the LED chip and the chip carrier without directly contacting the LED chip,
   wherein the protruding portion extends at the outermost lateral surface to be higher than the chip carrier.

14. The light-emitting device of claim 13, wherein the second end includes a section that extends in a direction perpendicular to a line between the first end and the second end.

15. The light-emitting device of claim 13, further comprising a second conductive line penetrating the submount, and having a third end connected to the LED chip, and a fourth end not touching the outermost lateral surface.

16. The light-emitting device of claim 15, wherein the first conductive line or the second conductive line do not contact the chip carrier.

17. The light-emitting device of claim 13, wherein the protruding portion is directly connected to the light converting layer.

* * * * *